United States Patent
Barabash et al.

(10) Patent No.: US 11,765,831 B1
(45) Date of Patent: Sep. 19, 2023

(54) RESISTIVE DEVICE

(71) Applicant: NOKIA SOLUTIONS AND NETWORKS OY, Espoo (FI)

(72) Inventors: Darrell Barabash, Grapevine, TX (US); Abhijit Ghose, Grapevine, TX (US); Joseph Smetana, Rockwall, TX (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 18/120,638

(22) Filed: Mar. 13, 2023

(30) Foreign Application Priority Data

Mar. 16, 2022 (FI) .................................... 20225236

(51) Int. Cl.
*H01C 7/06* (2006.01)
*H01C 7/13* (2006.01)
*H05K 1/16* (2006.01)
*H01C 7/00* (2006.01)

(52) U.S. Cl.
CPC ............. *H05K 1/167* (2013.01); *H01C 7/006* (2013.01)

(58) Field of Classification Search
USPC ................. 174/260; 338/262, 295, 314, 320; 438/385, 466, 469
See application file for complete search history.

(56) References Cited

U.S. PATENT DOCUMENTS

| 4,785,279 | A  | * | 11/1988 | Wetzel ................ H01L 27/0802 257/E27.047 |
| 5,466,484 | A  | * | 11/1995 | Spraggins ................ G01K 7/22 257/E27.047 |
| 7,030,728 | B2 | * | 4/2006 | Thei ..................... H01C 17/075 257/E27.047 |
| 9,114,747 | B2 | * | 8/2015 | Aoki ....................... B60N 2/002 |
| 9,702,777 | B2 | * | 7/2017 | Miyashita ............. G01L 9/0058 |
| 9,899,466 | B2 | * | 2/2018 | Muenz .................... H01L 28/20 |
| 2003/0048146 | A1 | | 3/2003 | Oldfield et al. |
| 2007/0091581 | A1 | | 4/2007 | Gisin et al. |
| 2008/0095542 | A1 | | 4/2008 | Jiang et al. |

(Continued)

FOREIGN PATENT DOCUMENTS

| CN | 109148065 A  | 1/2019 |
| DE | 19616847 A1 | 10/1996 |

OTHER PUBLICATIONS

Office Action and Search Report dated Aug. 12, 2022 corresponding to Finnish Patent Application No. 20225236.

(Continued)

*Primary Examiner* — Xiaoliang Chen
(74) *Attorney, Agent, or Firm* — SQUIRE PATTON BOGGS (US) LLP

(57) ABSTRACT

According to an aspect, there is provided a printed circuit board-based resistive device. The resistive device comprises, arranged on a substrate of the printed circuit board of the printed circuit board: a first conductive pad; a second conductive pad; a resistive patch having a first longitudinal end connected to the first conductive pad and a second longitudinal end connected to the second conductive pad, wherein a width of the resistive patch varies along a length of the resistive patch and has a maximum at a point between the first and second longitudinal ends.

5 Claims, 8 Drawing Sheets

(56) References Cited

U.S. PATENT DOCUMENTS

2009/0212878 A1  8/2009  Arai et al.
2011/0057766 A1* 3/2011  Chen .................... H01C 17/065
                                                338/262

OTHER PUBLICATIONS

Office Action dated Dec. 5, 2022 corresponding to Finnish Patent Application No. 20225236.
Office Action dated Feb. 9, 2023 corresponding to Finnish Patent Application No. 20225236.
Office Action dated Mar. 22, 2023, corresponding to German Patent Application No. 10 2023 106 461.4.

* cited by examiner

RESISTIVE DEVICE

CROSS REFERENCE TO RELATED APPLICATION

This application claims the benefit of Finnish Patent Application No. 20225236, filed Mar. 16, 2022. The entire content of the above-referenced application is hereby incorporated by reference.

TECHNICAL FIELD

Various embodiments relate generally to resistive devices.

BACKGROUND ART

For millimeter-wave (mm) applications, like 5G and 6G radios, resistive elements that provide a very wide frequency range (beyond 30 GHz), a low temperature coefficient, and adequate power handling are essential. Discrete components with these constraints have challenges in the design of equipment operating at these frequency ranges. At these frequency ranges and at higher frequency ranges, there is insufficient space for discrete components, which perform poorly in any case, due to the associated parasitics. Parasitic inductance and capacitances are generally regarded as impediment to the network, diminishing the transfer or matching characteristics at high frequency applications. Resistive devices can be embedded in printed circuit boards (PCBs). One common problem with planar film resistors (such as PCB-based resistive devices) are underlaying parasitic capacitance associated with dielectric region of the lossy dielectric and distributed inductance from its physical length. These parasitic effects make the resistors frequency dependent at higher frequencies.

BRIEF DESCRIPTION

According to an aspect, there is provided the subject matter of the independent claims. Embodiments are defined in the dependent claims. The scope of protection sought for various embodiments is set out by the independent claims.

The embodiments and features, if any, described in this specification that do not fall under the scope of the independent claims may be interpreted as examples useful for understanding various embodiments.

BRIEF DESCRIPTION OF THE DRAWINGS

In the following, some embodiments will be described with reference to the accompanying drawings, in which.

DETAILED DESCRIPTION OF SOME EMBODIMENTS

Figure 1:
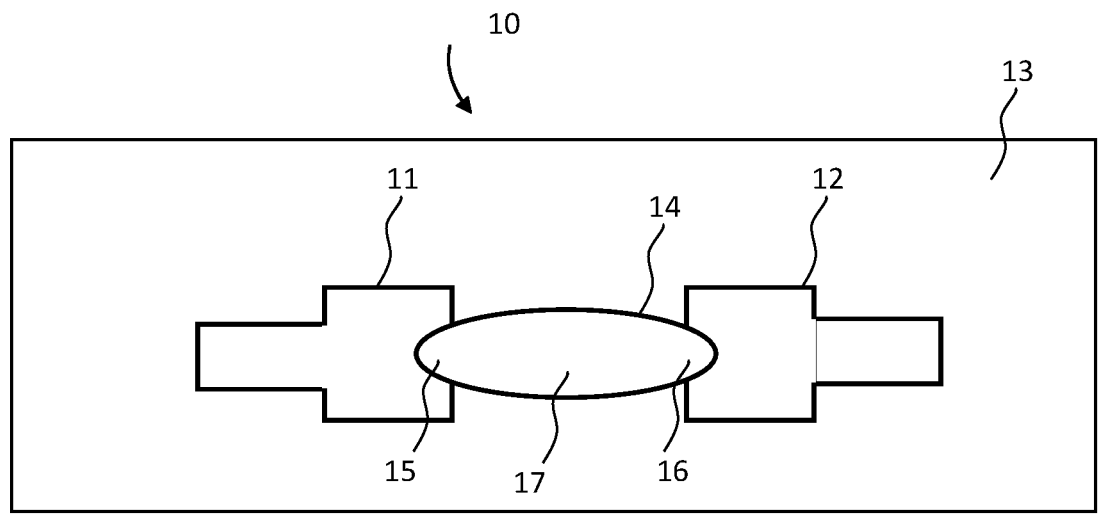
FIG. 1 illustrates an embodiment of a resistive patch with an elliptic contour between conductive pads.

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

Printed resistive devices are film resistive elements, which can be embedded into the substrate of a printed circuit board included on internal layers of multilayer printed circuit board as an integral part of the substrate and/or deposited on the surface layer of the printed circuit board. As such, the resistive film can be attached directly to conductive elements (most commonly implementing microstrip, coplanar or stripline structures) without needing to be soldered or mounted. The resistive film may be deposited on the same plane as the conductive element, thus eliminating for example the need for vias to route a signal from a plane to another plane or from a layer to another layer.

The geometry of the resistive patch and composition of resistive material used for forming the resistive patch may depend on the application (e.g., on the used frequency range and resistance value needed to be implemented by the resistive patch). Change in impedance is primarily due to a parasitic in the high frequency circuit, arising from physical pads, effective inductance from physical length of the embedded resistor, and discontinuities between resistive element and physical pads.

A resistive-conductive material (e.g. NiCr, NiCrAlSi and CrSiO) may be used to provide uniform sheet resistivity, often given as ohms/square area, for a resistive patch. Various sheet resistivities can be achieved by changing the composition of the resistive-conductive substance, and/or the thickness of the resistive patch.

One limitation of a conventional rectangular resistive element is an increase in parasitic capacitance and inductance values, arising from discontinuities between the physical conductive pad and the transmission line element of the resistive film. These parasitic elements influence the impedance seen at mm-wave applications, and the resistive impedance value tends to change with the frequency causing mismatch and other distortions of the signal.

Manufacturing process and associated tolerances manifest as additional challenges in high frequency circuit design. For example, using a steel wire screen technique, registration tolerance of the resistor films is in the range of 200 μm to 400 μm. Because of the stringent manufacturing tolerances, dimensions of the conductive pads need to be increased, causing increase of value of parasitic pad capacitance and potentially appearance of parasitic resonances within or around required operating frequency bands.

It is possible to absorb these parasitic effects into the solution rather then attempting to cancel their effects. The result of this approach is generally wide-band solution which is at the heart of this invention. Moreover, some specific shapes of resistive material are more optimum than others and are presented here as a non-exhaustive set of potential solutions.

To overcome said limitations, different embodiments are disclosed using new geometrical shapes of the printed resistive patch of a resistive device for balancing the inductive and capacitive reactance of the parasitic elements and thus increasing the frequency range of use of the resistive device.

According to an embodiment, which is illustrated in FIG. 1, a resistive device 10 is a PCB-based resistive device. Correspondingly, the resistive device 10 comprises a substrate 13 (of the PCB). The substrate 13 has a first side and a second side opposite to the second side, where the second side is metallic or metallized so as to form a ground plane. In FIG. 1, said first and second sides extend along the plane of the Figure (with only the first plane being visible). The resistive device 10 further comprises a resistive patch 14 and first and second conductive pads 11, 12 provided on the substrate 13 (or specifically on the first side thereof). The resistive patch 14 comprises a first longitudinal end 15 and a second longitudinal end 16. The longitudinal ends 15, 16 of the resistive patch 14 are overlapping with and connected to the first conductive pad 11 and the second conductive pad 12, respectively. The width of the resistive patch 14 varies along its length so that the resistive patch 14 has a maximum width 17 at a certain (longitudinal) point between the first longitudinal end 15 and the second longitudinal end 16 of the resistive patch 14 (i.e., not at either of the first and second longitudinal ends 15, 16). The longitudinal point (of the resistive patch 14) corresponding to said maximum width may be at least closer to the longitudinal midpoint of the resistive patch 14 than to either of the longitudinal ends 15, 16 respectively. The said maximum width may be at the central longitudinal point 17 between the first and second longitudinal ends 15, 16, that is, the resistive patch 14 may be widest at its longitudinal center.

FIG. 1 illustrates specifically a resistive patch 14 which has an elliptic shape. Specifically, the elliptical resistive patch 14 may be arranged along a longitudinal direction of the resistive device 10 (i.e., from left to right in FIG. 1). In other words, the elliptical resistive patch 14 may be arranged symmetrically so that its semimajor axis points from the (lateral) center of the first conduction pad 11 to the (lateral) center of the second conductive pad 12 (as is the case in FIG. 1).

The first and second conductive pads 11, 12 may be, for example, rectangular as shown in FIG. 1 or circular (though other shapes may also be employed). The first and second conductive pads 11, 12 may have the same geometry and dimensions.

According to another embodiment corresponding to FIG. 1, the width of the resistive patch 14 increases or remains constant from the first longitudinal end 15 to said point corresponding to a maximum width and from the second longitudinal end 16 to said point corresponding to a maximum width. In other words, the width of resistive patch 14 may increase monotonically from the first longitudinal end 15 to said point corresponding to a maximum width and from the second longitudinal end 16 to said point corresponding to the maximum width.

The resistive patch 14 may have essentially uniform thickness and/or may be made of resistive-conductive material (e.g. NiCr, NiCrAlSi and CrSiO), which allows to reach targeted electromagnetic characteristics of the resistive patch 14 by modifying the shape of the resistive patch 14. The resistive patch 14 may be a thin film of lossy material attached to the substrate of the printed circuit board. The shaping of the resistive patch 14 may be carried out, for example, using chemical etching, laser etching, mechanical routing to remove unwanted material.

In some embodiments, the resistive patch 14 may be made of resistive ink arranged on the substrate 13.

In some embodiments, the resistive patch 14 may be a thin film of lossy material deposited on the substrate 13.

In some embodiments, the resistive patch 14 may be a thick-film resistor layer made by screen printing using a resistive paste on the substrate 13.

FIGS. 2, 3a, 3b, 4a and 4b illustrate various alternative embodiments. Also in these embodiments, a width of the resistive patch 24, 34, 44, 54 and 64 varies along a length of the resistive patch and has a maximum at a (longitudinal) point between the first and second longitudinal ends (that is, not at either of the first and second longitudinal ends). Any of the definitions provided in connection with FIG. 1 may apply also here, unless otherwise stated.

Figure 2:
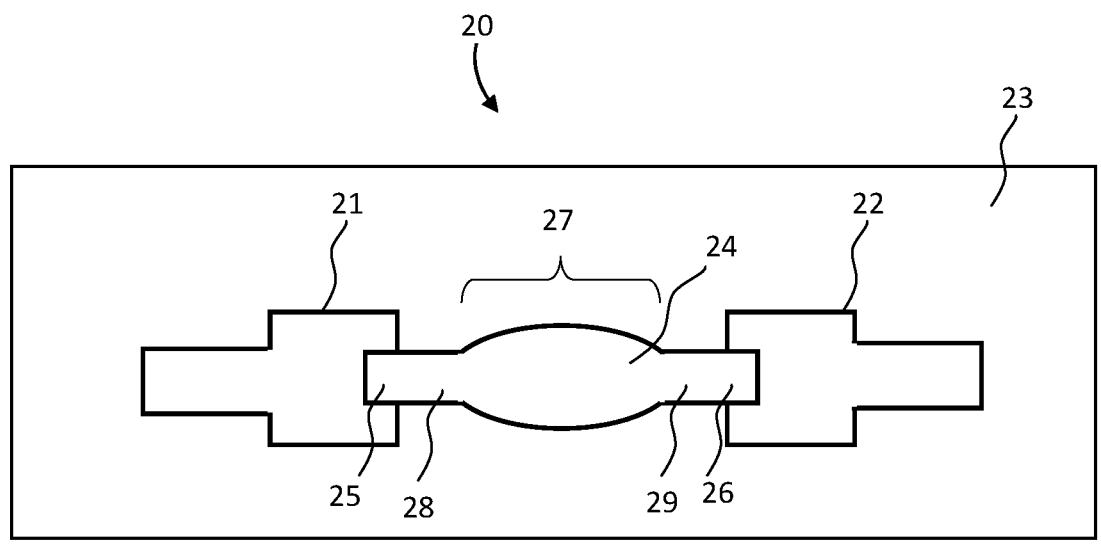
FIG. 2 illustrates an embodiment of a resistive patch with an elliptic contour and uniform section at each end of the patch and between conductive pads.

According to another embodiment, which is illustrated in FIG. 2, a resistive device 20 comprises a substrate 23, which has a first side and a second side opposite to the second side, where the second side is metallic or metallized so as to form a ground plane. The resistive device 20 further comprises a resistive patch 14 and first and second conductive pads 21, 22 provided on the substrate 23 (or specifically on the first side thereof). The resistive patch 24 comprises a first longitudinal end 25 and a second longitudinal end 26. The longitudinal ends 25, 26 of the resistive patch 24 are overlapping with and connected to the first conductive pad 21 and the second conductive pad 22, respectively. The resistive patch 24 comprises end sections 28, 29 and a middle section 28 arranged between (and in contact with) the end sections 28, 29. The middle section 27 may be wider than the end sections 28, 29. The end sections 28, 29 may be, for example, rectangular as shown in FIG. 2. The middle section 27 may have an elliptical shape as shown in FIG. 2 (though other shapes are also possible as will be discussed in connection with FIGS. 3b & 4b). Specifically, the elliptical middle section 27 may be arranged along a longitudinal direction of the resistive device 20 (i.e., from left to right in FIG. 2). In other words, the elliptical middle section 27 may be arranged symmetrically so that its semimajor axis is aligned with the (lateral) center points of the end sections 28, 29, that is, parallel to the intended primary direction of the current flowing through the resistive patch 24 (as is the case in FIG. 2).

Figure 3A:
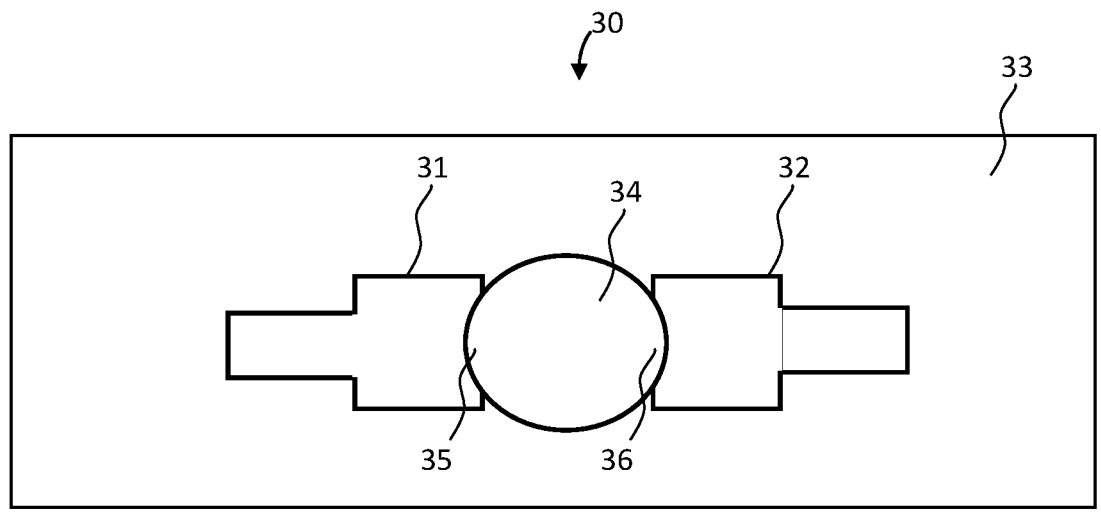
FIGS. 3a, 3b, 4a and 4b illustrate resistive patches of various shapes arranged between conductive pads according to embodiments.

FIG. 3a illustrates another resistive device 30 according to an embodiment. The resistive device 30 comprises similar elements as the resistive device 10 of FIG. 1. Namely, the resistive device 30 comprises, a substrate 33, having one metallic or metallized side forming a ground plane and a resistive patch 34 having two longitudinal ends 35, 36, and first and second conductive pads 31,32. However, in this embodiment, the resistive patch 34 has essentially a circular shape. The circular resistive patch 34 may be arranged symmetrically (and centrally) relative to the first and second conductive pads 31,32 (as shown in FIG. 3a).

Figure 3B:
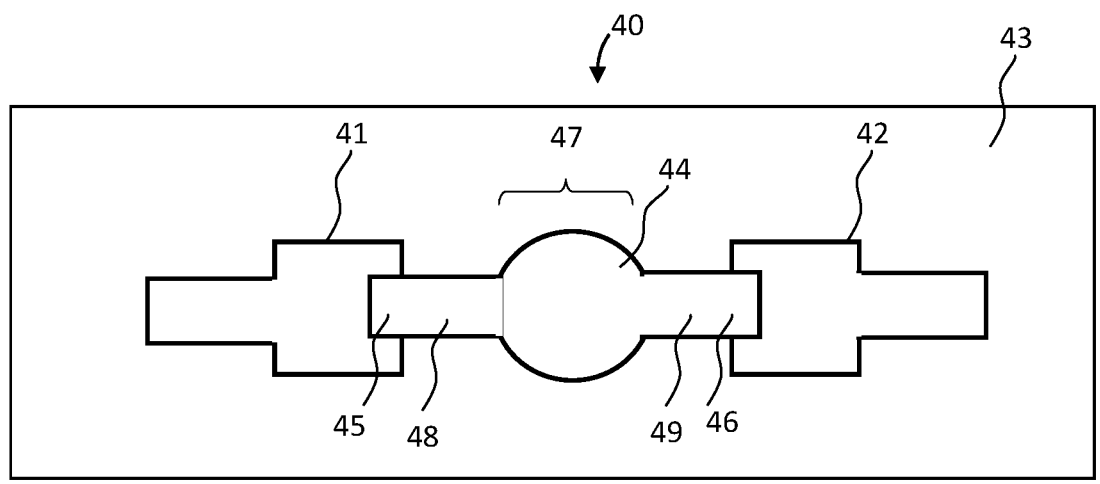

FIG. 3b illustrates another embodiment where a resistive device 40 comprises similar elements as the resistive device 10 of FIG. 1, that is, a substrate 43, having one metallic or metallized side forming a ground plane and a resistive patch 44 having two longitudinal ends 45, 46, and first and second conductive pads 41,42. Similar to FIG. 2, the resistive patch 44 comprises two (rectangular) end sections 48, 49 and a middle section 47 arranged between (and in contact with) the end sections 48, 49. In this embodiment, the middle section 47 has specifically a circular shape. The diameter of the circular middle section 47 is larger than the width of the end sections 48, 49. The circular middle section 47 may be arranged symmetrically (and centrally) between the two end sections 48, 49 (as shown in FIG. 3b).

Figure 4A:
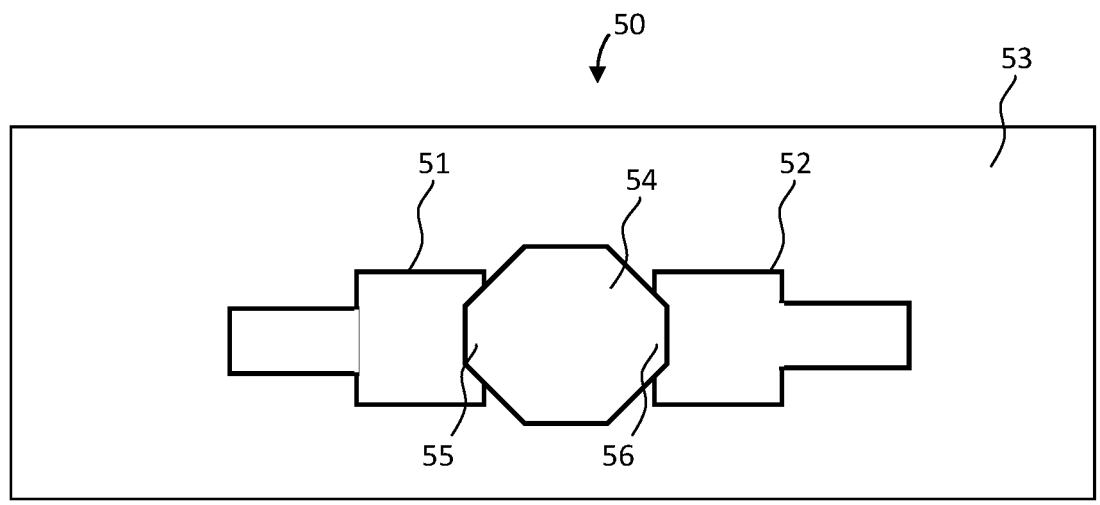

FIG. 4a illustrates another resistive device 50 according to an embodiment. The resistive device 50 comprises similar elements as the resistive device 10 of FIG. 1. Namely, the resistive device 50 comprises a substrate 53, having one metallic or metallized side forming a ground plane and a resistive patch 54 having two longitudinal ends 55, 56, and first and second conductive pads 51, 52. In this particular embodiment, the resistive patch 54 is essentially polygon-shaped. Said polygon may be a regular polygon (e.g., an octagon) or other polygon exhibiting rotational symmetry of order n (n being an integer larger than one). The regularly polygonal middle section 47 (or other suitably symmetric polygonal middle section 47) may be arranged symmetrically (and centrally) relative to the first and second conductive pads 51, 52 (as shown in FIG. 4*a*).

Figure 4B:
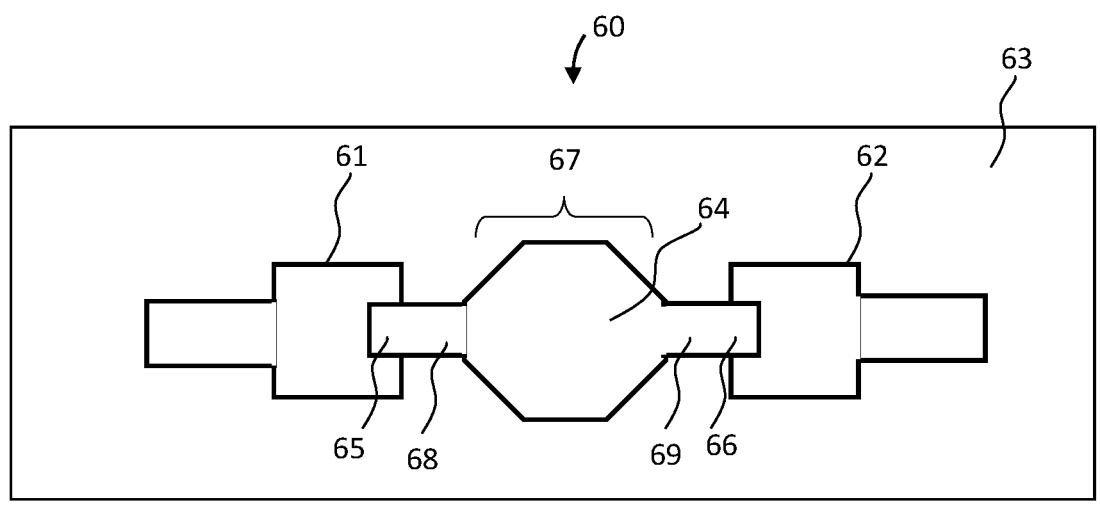

FIG. 4*b* illustrates another resistive device 60 according to an embodiment. The resistive device 60 comprises similar elements as the resistive device 10 of FIG. 1. Namely, the resistive device 60 comprise a substrate 63, metallic or metallized sides as ground planes and resistive patch 64 having two longitudinal ends 65, 66 and first and second conductive pads 61, 62. Similar to FIGS. 2 & 3*b*, the resistive patch 64 comprises end sections 68, 69 and a middle section 67 arranged between (and in contact with) the end sections 68, 69. The middle section 67 may be wider than the end sections 68, 69. In this embodiment, the middle section 68 is polygon-shaped. Said polygon may be a regular polygon (e.g., an octagon) or other polygon exhibiting rotational symmetry of order n (n being an integer larger than one). The polygonal middle section 67 may be arranged symmetrically (and centrally) between the two end sections 68, 69 (as shown in FIG. 4*b*).

In the following, a conventional resistive device and a resistive device according to an embodiment, are analyzed in order to demonstrate the benefits of the presented embodiments.

Capacitance of a conventional resistive patch, i.e. a microstrip with width W and length l and conductor thickness T can be calculated from equivalent capacitance using air dielectric. Capacitance of equivalent air dielectric is given by $$C_{air} = \frac{2\pi\,\epsilon_0}{\ln\left(\frac{8H}{W} + \frac{W}{4H}\right)} \text{ when } \frac{W}{H} < 1 \quad \text{(eq. 1)}$$

and $$C_{air} = \epsilon_0\left[\frac{W}{H} + 1.393 + 0.667\ln\left(\frac{W}{H} + 1.444\right)\right] \text{ when } \frac{W}{H} > 1 \quad \text{(eq. 2)}$$

and effective width $W_{eff}$ of the microstripline is given by $$W_{eff} = W + 0.398T\left[1 + \ln\left(\frac{4\pi W}{T}\right)\right] \text{ when } \frac{W}{H} < \frac{1}{2\pi} \quad \text{(eq. 3)}$$

and $$W_{eff} = W + 0.398T\left[1 + \ln\left(\frac{2H}{T}\right)\right] \text{ when } \frac{W}{H} > \frac{1}{2\pi} \quad \text{(eq. 4)}$$

where
W=width of the microstripline
H=height(dielectric) of microstripline and
T=conductor thickness
Based on (eq. 4) the effective dielectric constant can be calculated as $$\epsilon_{eff} = \frac{C}{C_{air}} \quad \text{(eq. 5)}$$

where C is capacitance per unit length of the microstripline, and $C_a$ is capacitance per unit length of equivalent air-filled dielectric.

Characteristic impedance of the microstripline is given by $$Z_c = \sqrt{\frac{L}{C}} = \frac{\sqrt{\epsilon_{eff}}}{c}\sqrt{\mu_0\,\epsilon_0} \quad \text{(eq. 6)}$$

where L is inductance per unit length and C is capacitance per unit length of the microstripline and further
$c_0 \approx 3\times10^8$ m/s is the velocity of light in vacuum
$\mu_0 \approx 12.566\times10^{-7}$ H/m (permeability of free space)
$\epsilon_0 \approx 8.854\times10^{-12}$ F/m (permittivity of free space)

$$\epsilon_{eff} = \frac{\epsilon_r + 1}{2} + \frac{\epsilon_r - 1}{2}\left(1 + \frac{12H}{W}\right)^{-1/2} + f(\epsilon_r, H) - 0.217(\epsilon_r - 1)\frac{T}{\sqrt{WH'}} \quad \text{(eq 7)}$$

where $\epsilon_r$ is effective dielectric constant of the dielectric material.

Using equations (1) to (7), capacitance and inductance associated with the microstrip segments can be calculated, as shown in the following table.

Figure 5A:
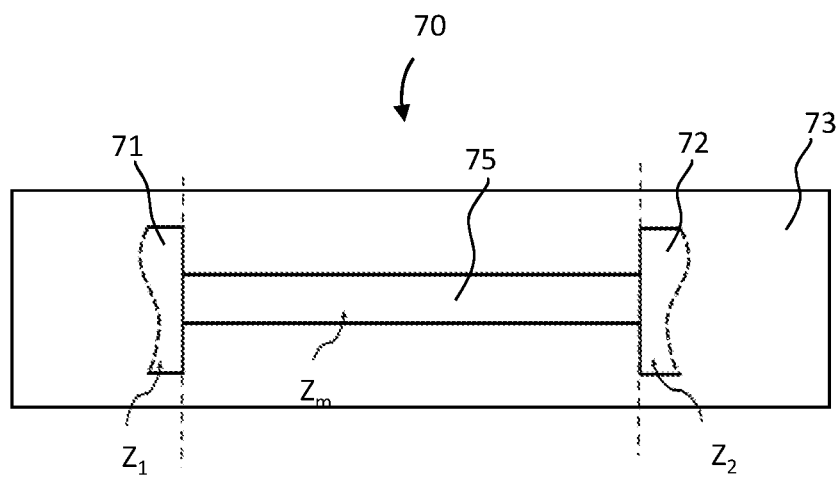
FIG. 5a illustrates a uniform transmission line structure and Figure Sb illustrates an electrical equivalent circuit of a transmission line with pad parasitic.
Figure 5B:
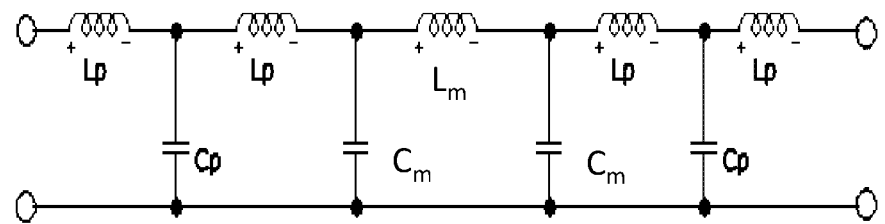

A uniform transmission line can be implemented with planar technology, e.g., microstrip technology. FIG. 5*a* illustrates a uniform transmission line 70 comprising a substrate 73, a microstrip 75, wherein the microstrip is connected to the conductive pads 71,72. The microstrip 75 is essentially a uniform resistive patch. The impedance of the resistive patch is depicted by $Z_m$, and the impedances of the conductive pads 71, 72 with $Z_1$, $Z_2$ respectively. Electromagnetic characteristics of a uniform resistive patch can be described with an equivalent circuit shown in Figure Sb where $C_{(i(i=m,p))}$ represent shunt incremental capacitive elements and $L_{(i(i=m,p))}$ represent series incremental inductive elements circuit and where indexes p, m represent the elements in the transmission line in Figure Sa and the corresponding inductances and capacitance of each element as shown in Figure Sb. The equivalent circuit includes the pad parasitic. Capacitance of a uniform resistive patch i.e. a microstrip with width W and length l and conductor thickness T can be calculated from equivalent capacitance using air dielectric.

Figure 6A:
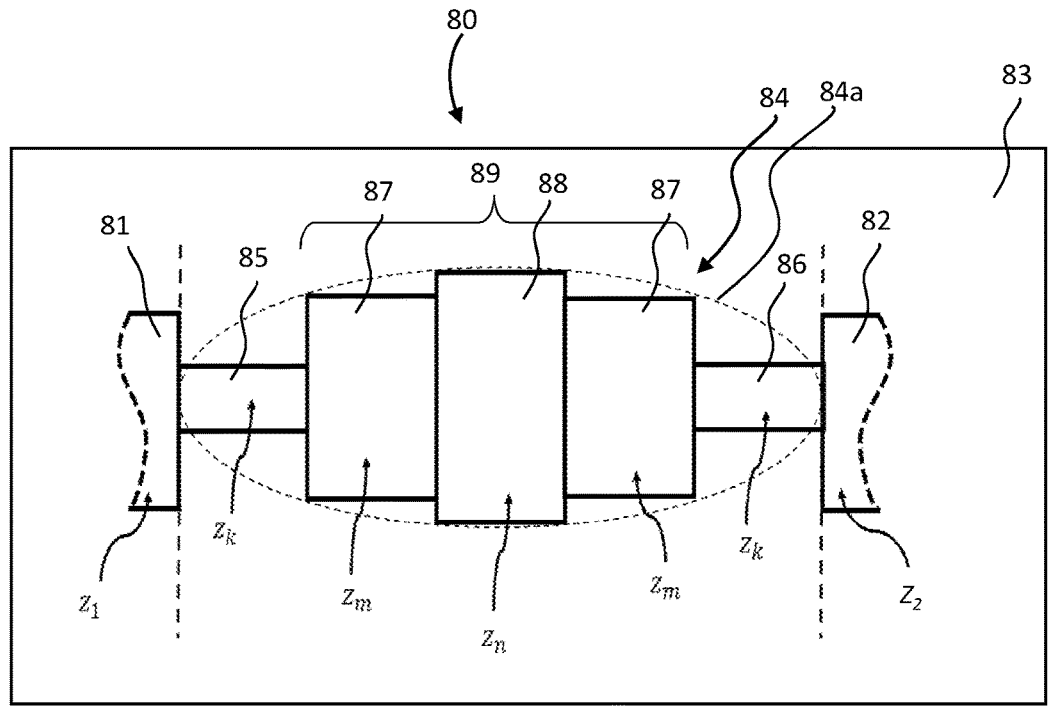
FIG. 6a illustrates a nonuniform transmission line structure and FIG. 6b illustrates the equivalent circuit electrical equivalent circuit of a nonuniform transmission line as cascaded L-C ladder network.
Figure 6B:
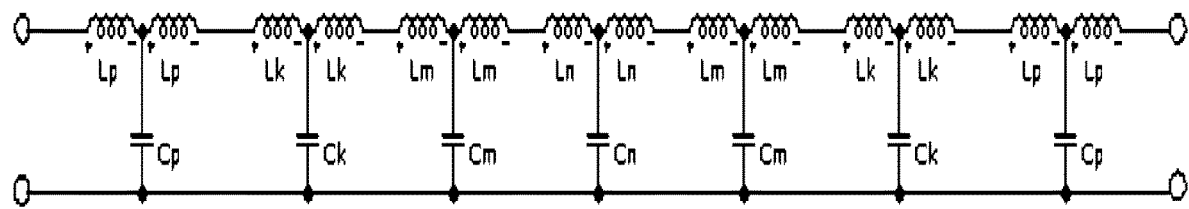

According to another embodiment, which is illustrated in FIG. 6*a*, the resistive device 80 comprises the resistive patch 84, wherein the middle section 89 of the resistive patch 84 comprises cascaded rectangular segments 87, 88 cascaded next to each other. The longitudinal ends 85, 86 of the resistive patch 84 are overlapping with and connected to the first conductive pad 81 and the second conductive pad 82, respectively. The resistive patch 84 can be considered as non-uniform transmission line. The impedance of the resistive patch 84 is depicted by the characteristic impedances $Z_k$, $Z_m$, $Z_n$, of the rectangular segments 85 ($Z_k$), 86 ($Z_k$), 87 ($Z_m$), 88 ($Z_n$) and the characteristic impedances of the conductive pads 71, 72 are depicted with $Z_1$. An electrical equivalent circuit of the nonuniform transmission line structure can be represented as a cascaded L-C ladder network where $C_{(i(i=p,k,m,n))}$ represent shunt incremental capacitive elements and $L_{(i(i=p,k,m,n))}$ represent series incremental inductive elements circuit and where p, k, m and n represent the indexes for each element in the cascade in FIG. 6*a* and the corresponding inductances and capacitance of each element as shown in FIG. 6*b*. Electromagnetic characteristics of the embodiment of the nonuniform resistive patch can be described with this equivalent. The operation of the nonuniform resistive device 80 will be best understood from the transmission characteristics of the network, which effectively constitutes with capacitive reactance(s) in shunt and inductive reactance(s) in series. For the comparison purpose with conventional structure, the group of segments 85, 86, 87, 88 of the present embodiment of the structure can be further reduced to five elements with varying impedances to facilitate direct computation of parasitic reactive elements from its L-C ladder equivalent circuit (FIG. 6*b*). The low order L-C network can be readily increased to higher orders to represent continuous structure as shown in dotted contour 84*a* in FIG. 6*a*.

The shunt element of the cascaded line can be calculated from characteristic impedance $Z_i$, phase velocity $v_i$ and physical length $l_i$ of the corresponding segment as follows:

$$C_i = \frac{l_i}{z_i v_i} \quad \text{(eq. 8)}$$

Similarly, for electrically short lengths, series inductance can be calculated as:

$$L_i = \frac{z_i l_i}{2 v_i} \quad \text{(eq. 9)}$$

with i=p, k, m, and n represent indices of the nonuniform segments (with p=1, 2) as shown in FIG. 6*a*.

Again, using equations (1) to (7), capacitance and inductance associated with the cascaded line segments of the present embodiment (FIG. 6*a*) can be calculated, as shown in the following tables:

| $Z_1$ | W [mm] | H [mm] | W/H | $\epsilon_r$ | $\epsilon_{reff}$ | $\epsilon_0$ [F/m] |
|---|---|---|---|---|---|---|
| $Z_1$ | 0.51 | 0.51 | 1 | 3.3 | 2.468953 | 8.85E−12 |
| $Z_k$ | 0.18 | 0.51 | 0.352941 | 3.3 | 2.364126 | 8.85E−12 |
| $Z_m$ | 0.78 | 0.51 | 1.529412 | 3.3 | 2.536652 | 8.85E−12 |
| $Z_n$ | 0.95 | 0.51 | 1.862745 | 3.3 | 2.571551 | 8.85E−12 |
| $Z_m$ | 0.78 | 0.51 | 1.529412 | 3.3 | 2.536652 | 8.85E−12 |
| $Z_k$ | 0.18 | 0.51 | 0.352941 | 3.3 | 2.364126 | 8.85E−12 |
| $Z_2$ | 0.51 | 0.51 | 1 | 3.3 | 2.468953 | 8.85E−12 |

| $Z_i$ | $C_{ai}/\epsilon_0$ [/m] | $Z_{ci}$ [ohm] | $C_i$/mm [/mm] | $C_i$ [F] | $L_i$ [H] |
|---|---|---|---|---|---|
| $Z_1$ | 2.98E+00 | 8.06E+01 | 6.51E−14 | 4.94E−15 | 3.21E−11 |
| $Z_k$ | 2.01E+00 | 1.22E+02 | 4.21E−14 | 3.20E−15 | 4.75E−11 |
| $Z_m$ | 3.64E+00 | 6.50E+01 | 8.18E−14 | 6.21E−15 | 2.62E−11 |
| $Z_n$ | 4.02E+00 | 5.84E+01 | 9.16E−14 | 6.96E−15 | 2.37E−11 |
| $Z_m$ | 3.64E+00 | 6.50E+01 | 8.18E−14 | 6.21E−15 | 2.62E−11 |
| $Z_k$ | 2.01E+00 | 1.22E+02 | 4.21E−14 | 3.20E−15 | 4.75E−11 |
| $Z_2$ | 2.98E+00 | 8.06E+01 | 6.51E−14 | 4.94E−15 | 3.21E−11 |

In the table, $C_{ai}$ refers to capacitance per unit length of segment i in the cascade and $Z_{ci}$ refers to impedance of the segment i in the cascade.

Figure 7:
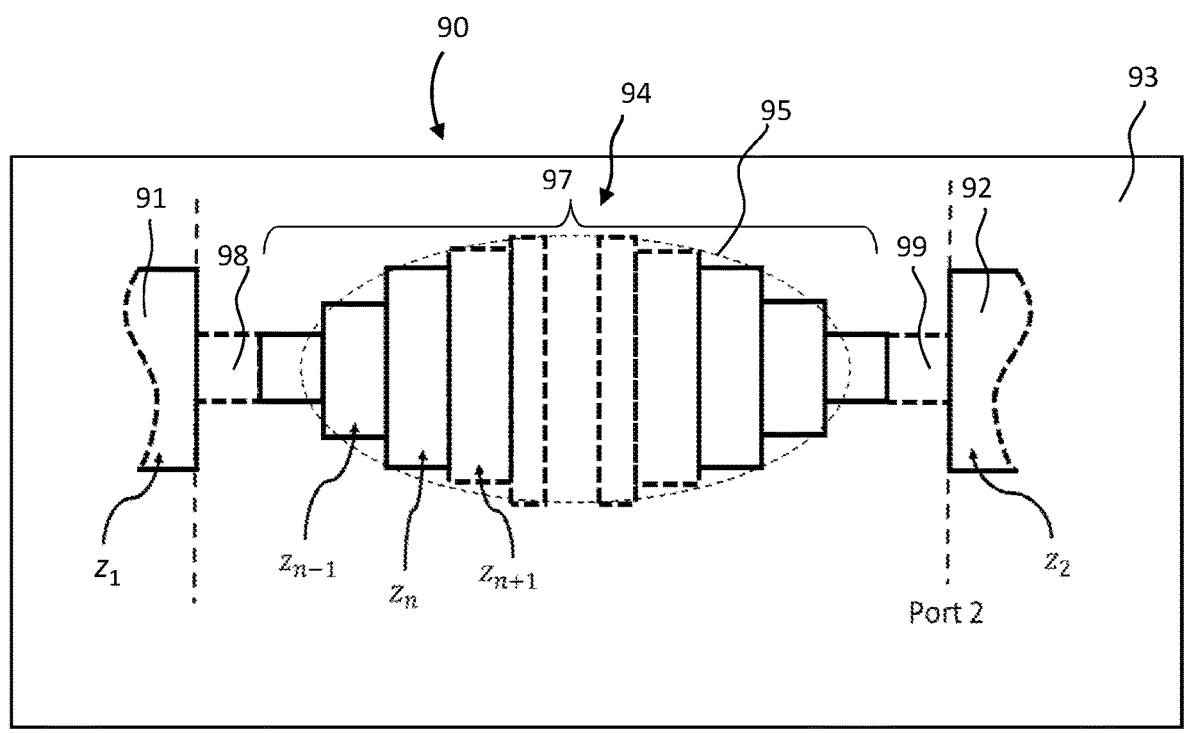
FIG. 7 illustrates a generalized nonuniform transmission line structure.

Another embodiment presents a generalized structure of a resistive device 90 in FIG. 7. Also in this embodiment, a width of the resistive patch 94 varies along a length of the resistive patch 94 and has a maximum at a point between the first and second longitudinal ends (that is, not at either of the first and second longitudinal ends). Any of the definitions provided in connection with FIG. 1 may apply also here, unless otherwise stated.

In FIG. 7, an elliptical patch shape 94 is approximated as a set of cascaded uniform transmission line segments 97 as shown in FIG. 7, keeping the perimeter around the area same as nonuniform structure. The longitudinal ends 98, 99 of the resistive patch 94 are overlapping with and connected to the first conductive pad 91 and the second conductive pad 92, respectively. The segmentation approach gives more flexibility to determine equivalent circuit parameters of inherent parasitics. Discrete to continuous conversion of the nonuniform transmission line structure can be readily established by increasing the number of segments 97 in FIG. 7 to infinity. The low order L-C network can be readily increased to higher orders to represent continuous structure as shown in dotted contour 95 in FIG. 7. The impedance of the resistive patch 94 is depicted by the impendences $Z_{n-1}$, $Z_n$, $Z_{n+1}$, of the impedances of the rectangular segments 97 and the impedances of the conductive pads 91, 92 are depicted with $Z_1$, $Z_2$ respectively.

Figure 8:
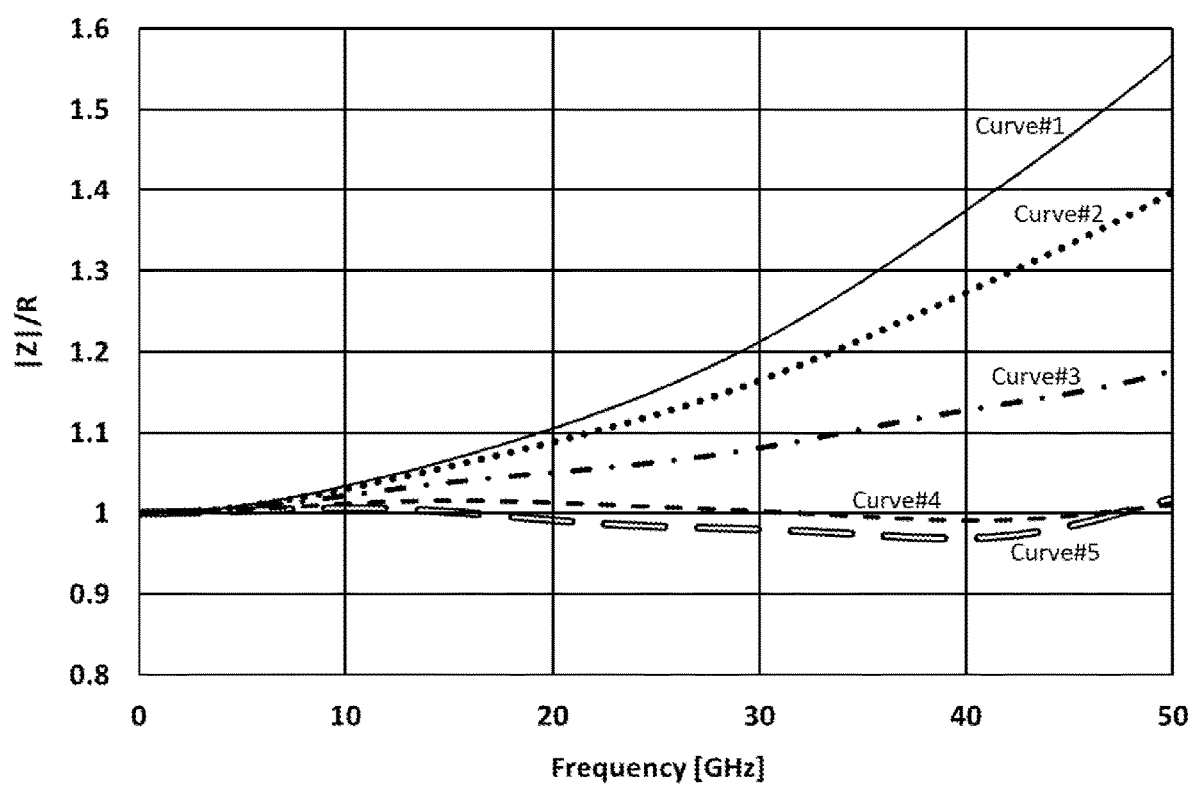
FIG. 8 illustrates resistive impedance values vs frequency compared for the conventional rectangular patch structure, and for circular and elliptical patch structures.

FIG. 8 shows impedance values relative to DC resistance value as function of frequency for five example cases:

Curve #1: Conventional rectangular resistive patch with width 0.20 mm×length 0.81 mm (structure shown in FIG. 5*a*)

Curve #2: Resistive patch with rectangular end sections (with width 0.20 mm) and a circular middle section (radius R=0.15 mm), overall length 0.81 mm, (structure shown in FIG. 3*b*)

Curve #3: Resistive patch with rectangular end sections (with width 0.20 mm) and a circular middle section (radius R=0.20 mm), overall length 0.81 mm, (structure shown in FIG. 3*b*)

Curve #4: Resistive patch with rectangular end section (with width 0.20 mm) and an elliptical middle section (radii 0.36 mm, 0.23 mm), overall length 0.81 mm, (structure shown in FIG. 2)

Curve #5: Resistive patch with an elliptical shape (radii 0.64 mm, 0.23 mm), overall length 0.81 mm, (structure shown in FIG. 1)

In each of the example cases represented by the curves #1 to #5, the overall length is the distance between the conductive pads. From FIG. 8 one can observe that, for example, the circle-based (especially one with 0.20 mm radius) and ellipse-based structures in this disclosure show extended frequency of operation compared to conventional rectangular structure and have minimum deviation (+/−10% Ω) from the DC resistance value up to 50 GHz.

Frequency response of the conventional structure is limited by inherent parasitic associated with physical length and width of the transmission line, together with fringing fields, represented by parasitic capacitance (shunt C) and inductance (series L) at the discontinuities. Nonuniform transmission lines (NUTL) are generally used to design planar microwave structures like couplers, filters, and impedance matching applications. In the present disclosure, a nonuniform transmission line (NUTL) method is used to absorb the unwanted shunt C and series L elements to create a LC ladder network that approximates the transmission line. As such, this creates a low pass structure that is relatively insensitive to frequency at well below the cutoff frequency. It represents a transmission line of characteristic impedance $$\sqrt{\frac{L}{C}}$$

and the 3 dB cutoff is at $$\frac{1}{2\pi\sqrt{LC}}$$

where L and C are equivalent inductance and capacitance of the transmission line structure. In this manner the parasitics become part of the solution rather than the problem. This extends the resistive part of the transmission line impedance and increases the bandwidth of operation.

The advantages of the present disclosure are improved and/or desired response characteristic by utilizing the parasitic of the circuit itself instead of minimizing it, by readjusting the reactive properties of the transfer network using nonuniform transmission line (NUTL), and thus maximizing the bandwidth advantage compared to conventional transmission line structure.

Parasitic inductance and capacitances are diminishing the transfer or matching characteristics at high frequency applications. As such, the cutoff frequency is lower using conventional structure due to parasitics associated with the transmission line. This is regarded as disadvantage using conventional structure, which is essentially narrow band and makes the embedded device unusable above 40 GHz.

Parasitic effects associated with physical dimensions of embedded resistors make said embedded resistors frequency dependent. Complex impedance value of the embedded resistors changes with frequency, primarily due to fringing capacitance, effective inductance from physical length of the structure of the resistive element, physical pads of the device, and discontinuities between resistive element and physical pad. In this disclosure, structures are disclosed, which absorb parasitic effects by using novel shapes of the embedded resistive element, and thus converting the complex impedance to the characteristic impedance of an equivalent transmission line. Discontinuities between pad and resistive element can be readjusted. Pad parasitic can be determined by measurement-based parameter extraction method. Frequency range of the resistors can be substantially increased compared to embedded resistors using conventional approach of rectangular patch.

Another advantage of the disclosure is in cost reduction. Microwave suitable resistors can cost in the order of dollars and large antenna arrays can contain a hundred or more of them. Printed resistors, on the other hand, only have the cost of the resistive ink which is clearly less expensive.

It is obvious for a person skilled in the art that the embodiments may also be applied to other kinds of communications networks having suitable means by adjusting parameters and procedures appropriately.

The embodiments are not, however, restricted to the system given as an example but a person skilled in the art may apply the solution to other communication systems provided with necessary properties.

Even though the embodiments have been described above with reference to examples according to the accompanying drawings, it is clear that the embodiments are not restricted thereto but can be modified in several ways within the scope of the appended claims. Therefore, all words and expressions should be interpreted broadly, and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. A printed circuit board-based resistive device comprising, disposed on a substrate of the printed circuit board:
    a first conductive pad;
    a second conductive pad;
    a resistive patch having a first longitudinal end connected to the first conductive pad and a second longitudinal end connected to the second conductive pad, wherein the resistive patch comprises a first end section at the first longitudinal end of the resistive patch, a middle section, and second end section at the second longitudinal end of the resistive patch, wherein the middle section comprises a plurality of rectangular segments cascaded next to each other, and wherein the plurality of rectangular segments is approximating an elliptic shape; and
    wherein a width of the resistive patch varies along a length of the resistive patch and has a maximum at a point between the first and second longitudinal ends.

2. The resistive device according to claim 1, wherein the first and second end sections of the resistive patch are rectangular.

3. The resistive device according to claim 1, wherein the resistive patch comprises resistive ink disposed on the substrate of the printed circuit board.

4. The resistive device according to claim 1, wherein the resistive patch comprises a thin film of lossy material deposited on the substrate of the printed circuit board.

5. The resistive device according to claim 1, wherein the resistive patch comprises a thin film of lossy material attached to the substrate of the printed circuit board and shaped by chemical etching, laser etching, mechanical routing to remove unwanted material.

* * * * *